United States Patent
Himes et al.

(10) Patent No.: US 6,728,068 B1
(45) Date of Patent: Apr. 27, 2004

(54) HEAD GIMBAL ASSEMBLY INTERCONNECTING LEADS HAVING IMPROVED ROBUSTNESS AND LOWER STIFFNESS

(75) Inventors: Adam K. Himes, Richfield, MN (US); Michael S. Bowers, Bloomington, MN (US); Paul E. Kupinski, Eagan, MN (US)

(73) Assignee: Seagate Technology LLC, Bloomington, MN (US)

( * ) Notice: Subject to any disclaimer, the term of this patent is extended or adjusted under 35 U.S.C. 154(b) by 0 days.

(21) Appl. No.: 09/382,891

(22) Filed: Aug. 25, 1999

Related U.S. Application Data

(60) Provisional application No. 60/133,185, filed on May 7, 1999.

(51) Int. Cl.[7] .................................................. G11B 5/17
(52) U.S. Cl. ..................................................... 360/234.5
(58) Field of Search ........................... 360/234.5, 234.4, 360/235, 244.1; 219/121.63; 235/451; 29/825

(56) References Cited

U.S. PATENT DOCUMENTS

| | | | |
|---|---|---|---|
| 3,519,890 A | 7/1970 | Ashby | 317/101 |
| 4,109,096 A | 8/1978 | Dehaine | 174/68 |
| 4,640,499 A | 2/1987 | Hemler et al. | 267/160 |
| 5,111,097 A | 5/1992 | Londergan et al. | 310/261 |
| 5,124,880 A | 6/1992 | Okamoto et al. | 361/306 |
| 5,353,621 A | 10/1994 | Knecht et al. | 72/379.2 |
| 5,739,982 A * | 4/1998 | Arya et al. | 360/234.5 |
| 5,828,031 A * | 10/1998 | Pattnaik | 219/121.63 |
| 5,930,082 A * | 7/1999 | Arisaka et al. | 360/234.5 |
| 5,956,208 A * | 9/1999 | Kawazoe | 360/234.5 |
| 6,046,882 A * | 4/2000 | Pattnaik et al. | 360/234.5 |
| 6,181,520 B1 * | 1/2001 | Fukuda | 360/244.1 |
| 6,202,299 B1 * | 3/2001 | DiStefano et al. | 228/123.1 |
| 6,293,464 B1 * | 9/2001 | Smalley, Jr. | 235/435 |
| 6,336,269 B1 * | 1/2002 | Eldridge et al. | 228/180.5 |

* cited by examiner

Primary Examiner—Tianjie Chen
(74) Attorney, Agent, or Firm—Kinney & Lange, P.A.

(57) ABSTRACT

A flexible circuit for use in a head gimbal assembly having low stiffness and high robustness. The flexible interconnect circuit has interconnecting leads which connect the flexible interconnect circuit to a transduction head. To ensure the transducing head is able to follow the surface of the disc and properly read from and write to the disc, the interconnect leads are constructed with a varying width. The leads are widened at the points where breakage usually occurs and are narrowed at a middle portion to ensure the leads maintain the desired flexibility.

13 Claims, 4 Drawing Sheets

HEAD GIMBAL ASSEMBLY INTERCONNECTING LEADS HAVING IMPROVED ROBUSTNESS AND LOWER STIFFNESS

CROSS-REFERENCE TO RELATED APPLICATION(S)

This application claims priority from Provisional Patent Application Serial No. 60/133,185 filed on May 7, 1999, for "Head Gimbal Assembly Interconnecting Leads Having Improved Robustness and Lower Stiffness" by Adam Karl Himes, Michael Scott Bowers, and Paul Eugene Kupinski.

BACKGROUND OF THE INVENTION

The present invention relates to a head gimbal assembly in a disc drive system, and more particularly to the interconnecting leads which connect the transducing head to the flexible interconnect circuit.

Disc drives are well known in the art and comprise several discs, each disc having several concentric data tracks for storing data. A transducing head is used to read from or write to a data track on a disc. As the disc is spun, the head is positioned above a data track on a disc by moving an actuator arm on which the head is suspended. The arm is moved using a large scale actuation motor, such as a voice coil motor.

The head is mounted on the actuator arm using a head gimbal assembly. A standard head gimbal assembly comprises a load beam, a gimbal, a flexible interconnect circuit, and the head. The load beam provides the main support structure for the head gimbal assembly. A gimbal is attached under the load beam, and the head is attached to the gimbal. The gimbal is designed to allow the head to follow the surface of the disc more closely than if the head were mounted directly on the load beam. The flexible interconnect circuit is laid on top of the load beam and provides the circuitry to and from the head in the form of interconnect leads. The leads connect the flexible interconnect circuit to the head and thus allow electronic signals to pass between the two.

All parts of the head gimbal assembly are constructed to accommodate high precision movement so that the head can be placed above a desired data track. In addition, the design of the head gimbal assembly must allow the head to closely follow the surface of the disc as the disk is spinning. To allow the head to do so, the gimbal and flexible interconnect must be flexible. In particular, the leads connecting the head to the flexible interconnect circuit must have low stiffness. At the same time, the leads must be robust enough to survive the manufacturing process and day-to-day use.

Typically, prior art leads have a uniform width that is kept small to ensure flexibility, but the small width also causes the prior art leads to be fragile and easily breakable. Though it is possible to widen the leads to increase their robustness, when widened the leads become too stiff and prevent the head from moving in such a manner as to be able to follow the disc surface. If the leads are made narrower, the stiffness is reduced and the head is able to achieve the desired range of motion. However, as the leads are made to be more narrow, the leads also become less robust and experience a much higher incidence of breakage. When breakage occurs, it most often happens at the point where the lead must be bent to allow the lead to be attached to the head.

In an effort to strengthen the leads and improve their robustness and resistance to fatigue, an adhesive conformal coat may be selectively placed onto the leads. However, this process is time consuming and is difficult to control. Furthermore, it does nothing to address the breakage that occurs at the areas where the leads are bent.

Thus, there is a need in the art for a head gimbal assembly having interconnecting leads which are robust enough to survive the manufacturing process and use while being flexible enough to allow the head gimbal assembly to function.

BRIEF SUMMARY OF THE INVENTION

The present invention relates to head gimbal assembly interconnecting leads having improved robustness and lower stiffness. The interconnecting leads are shaped so that the width of the leads varies at points where the lead is likely to break. Specifically, the width of the lead at the point it becomes unsupported by the flex circuit is made wider. The lead is also made wider at the top of the head bond pad. To insure that the pitch stiffness remains low enough to allow the head to move over the disc surface, portions of the lead are made narrower. By widening some portions of the lead and narrowing other portions of the lead, it is possible to reach a point where the lead is made much more robust, yet retains the low stiffness required for the head gimbal assembly to function properly.

DETAILED DESCRIPTION

Figure 1:
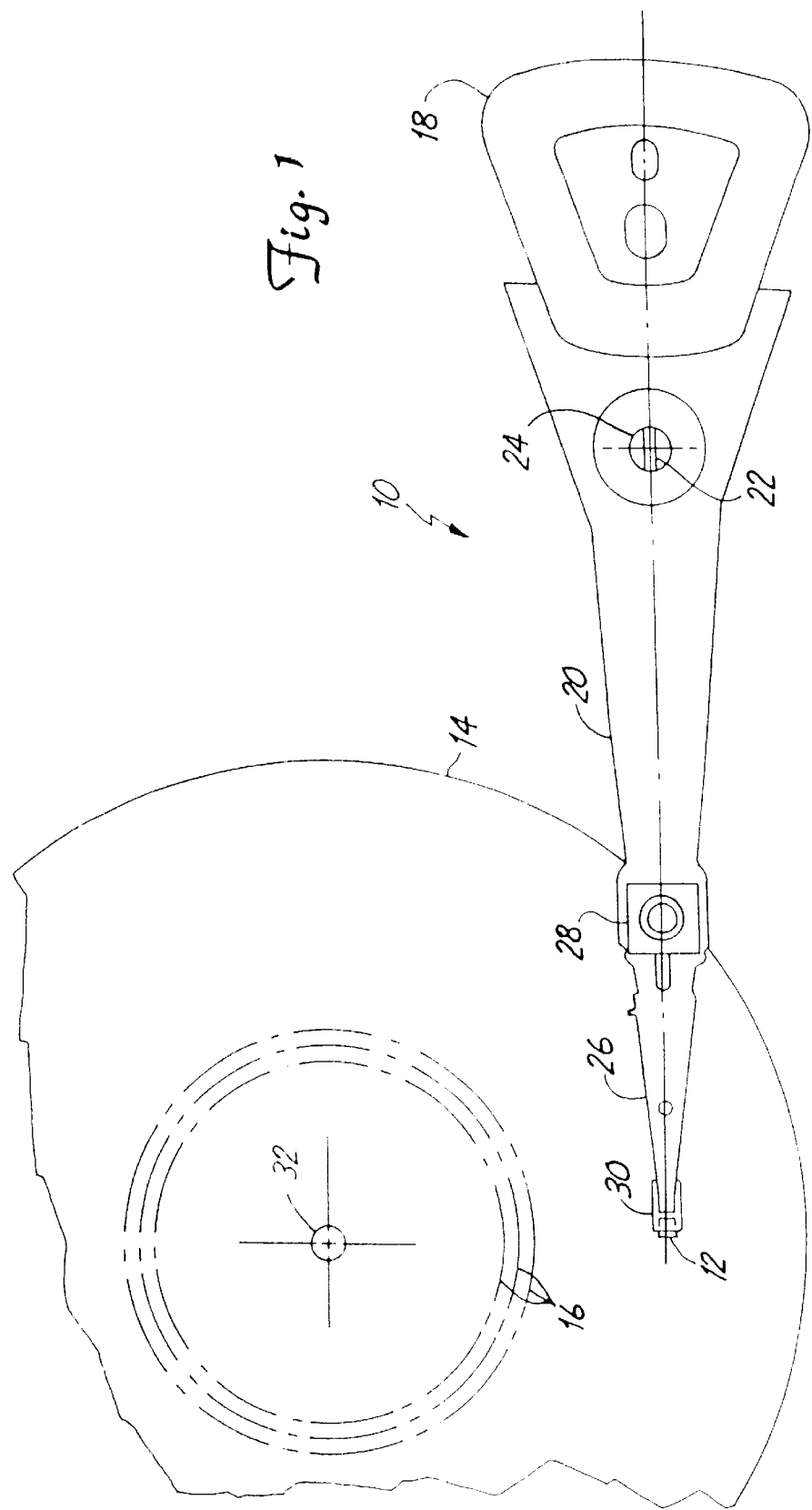
FIG. 1 is a plan view of disc drive actuation system for positioning a slider over tracks of a disc.

FIG. 1 is a plan view of a disc actuation system 10 for positioning a head 12 over a selected track 16 of a disc 14. An actuation system 10 includes a voice coil motor (VCM) 18 arranged to rotate actuator arm 20 around axis 22 on spindle 24. The head suspension includes a load beam 26 connected to the actuator arm 20 at a head mounting block 28. A gimbal 30 is connected to an end of the load beam 26, and carries the head 12. The head 12 is a transducing head for reading from or writing to the concentric tracks 16 of the disc 14. The disc 14 rotates about an axis 34, so that windage is encountered by the head 12 to keep it aloft a small distance above the surface of disc 14. The head 12 must be able to closely follow the surface of the disc 14, including any imperfections in the topography of the disc 14, as the head 12 travels over the spinning disc 14.

Figure 2:
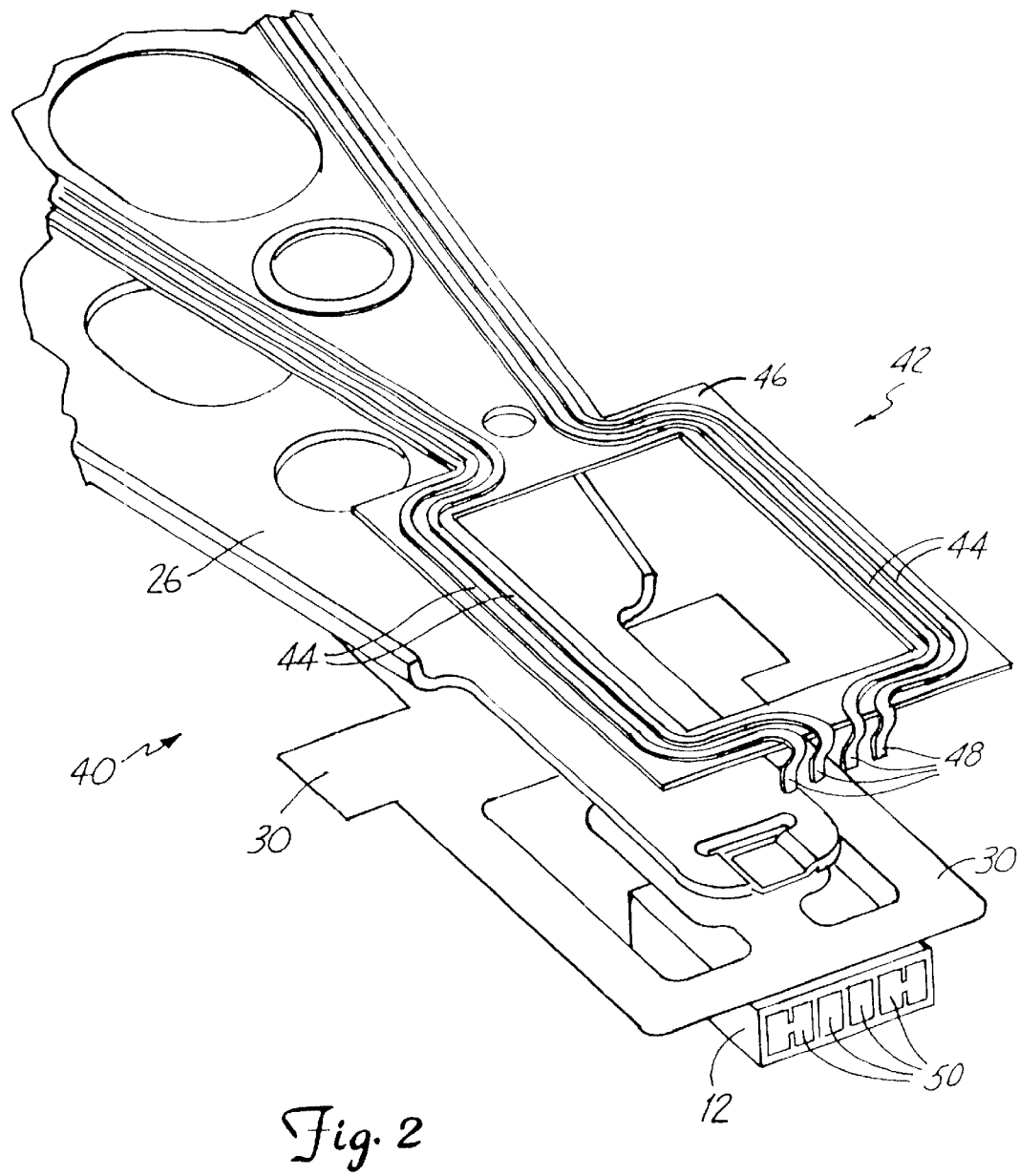
FIG. 2 is an exploded perspective view of a portion of a head gimbal assembly.

FIG. 2 is a perspective view of a greatly enlarged head gimbal assembly 40. Visible is a flexible interconnect circuit 42 with traces 44 on a polyimide substrate 46. The traces 44 terminate in leads 48 when they become unsupported by the substrate 46. Also visible are the load beam 26, the gimbal 30, and the head 12. On the head 12 are bond pads 50. The head 12 is attached to the gimbal 30, typically with the use of an adhesive or glue. The gimbal 30 is mounted on the underside of the load beam 26 in a conventional manner. The gimbal 30 allows more flexibility to be imparted to the head 12 than if the head 12 were attached directly to the load beam 26. The flexible interconnect circuit 42 lays on the load beam 26. As the leads 48 extend past the substrate 46, they are bent to allow the leads 48 to be attached to the head 12 at the bond pads 50.

The flexible interconnect circuit 42 is configured of a polyimide substrate and the traces 44 are made of,bold plated copper. The bond pads 50 are fabricated from gold. The traces 44 and leads 48 allow electronic signals to be passed between the flexible interconnect circuit 42 and the head 12.

To allow the head 12 to be compliant enough to follow the disc surface as the disc spins, it is important for the leads 48 which connect the flexible interconnect circuit 42 and the transducing head 12 to be as compliant as possible to reduce the torque imparted by the air bearing. At the same time, the leads 48 must be robust enough so that they do not break or fracture during the assembly process or during use. Prior art leads were typically fabricated from gold plated copper and had a uniform width. The present invention results in leads 48 that are both robust and resistant to breaking or fatigue failure, yet also have a reduced stiffness so that the head 12 is able to follow the surface of a spinning disc more closely.

Figure 3:
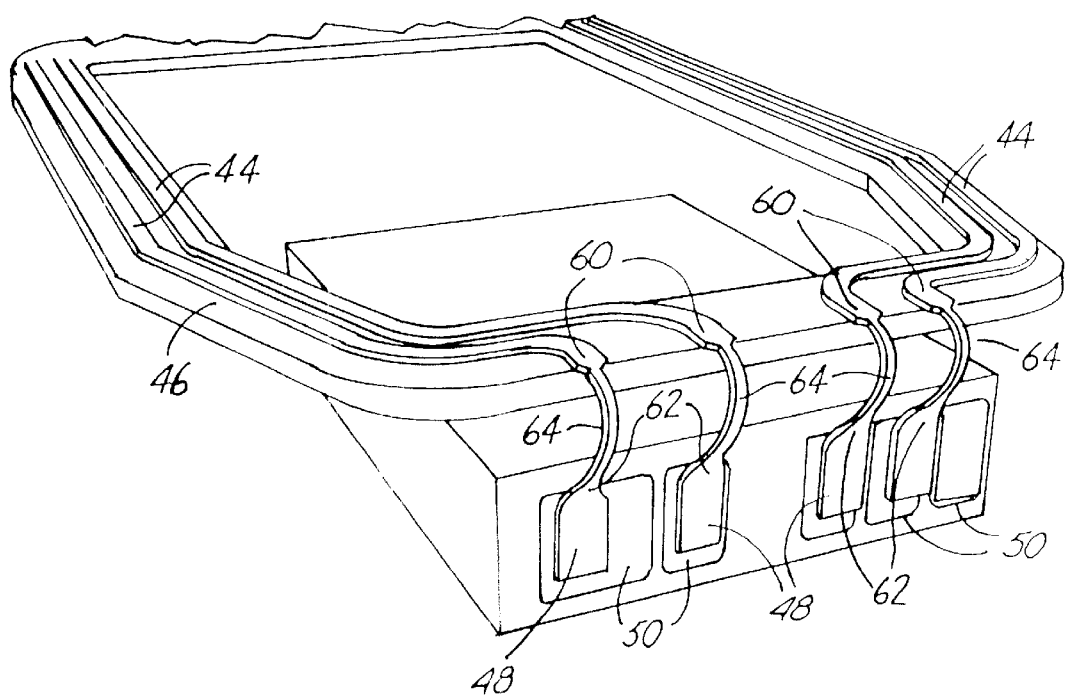
FIG. 3 is a perspective view of a head gimbal assembly with variable width head leads.

FIG. 3 is a perspective view of a portion of a head gimbal assembly. Visible in FIG. 3 is the flexible interconnect circuit 42, traces 44, leads 48, the head 12, and head bond pads 50. The traces 44 run along the surface of the flexible interconnect circuit 42 and the leads 48 of the traces 44 are attached to the bond pads 50. As can be seen, the leads 48 must be bent to allow to the leads 48 to connect the flexible interconnect circuit 42 to the head 12. When the leads 48 are bent, a knuckle 60 is created at the point the lead 48 becomes unsupported by the flexible interconnect circuit 42. A heel 62 is created at the point where the lead 48 is again bent so that it can meet the bond pad 50. The leads 48 have a middle portion 64 between the knuckle 60 and the heel 62.

To improve the robustness, and thus the resistance to breakage, the present invention makes the leads 48 wider at the knuckle 60 and heel 62, yet correspondingly make the leads 48 narrower at the middle portion 64 between the knuckle 60 and heel 62. This narrowing of the middle portion 64 decreases the stiffness of the flexible interconnect circuit, while widening the leads 48 at the knuckle 60 and heel 62 greatly increasing the resistance to fatigue and robustness of the leads 48 and results in less breakage.

Figure 4:
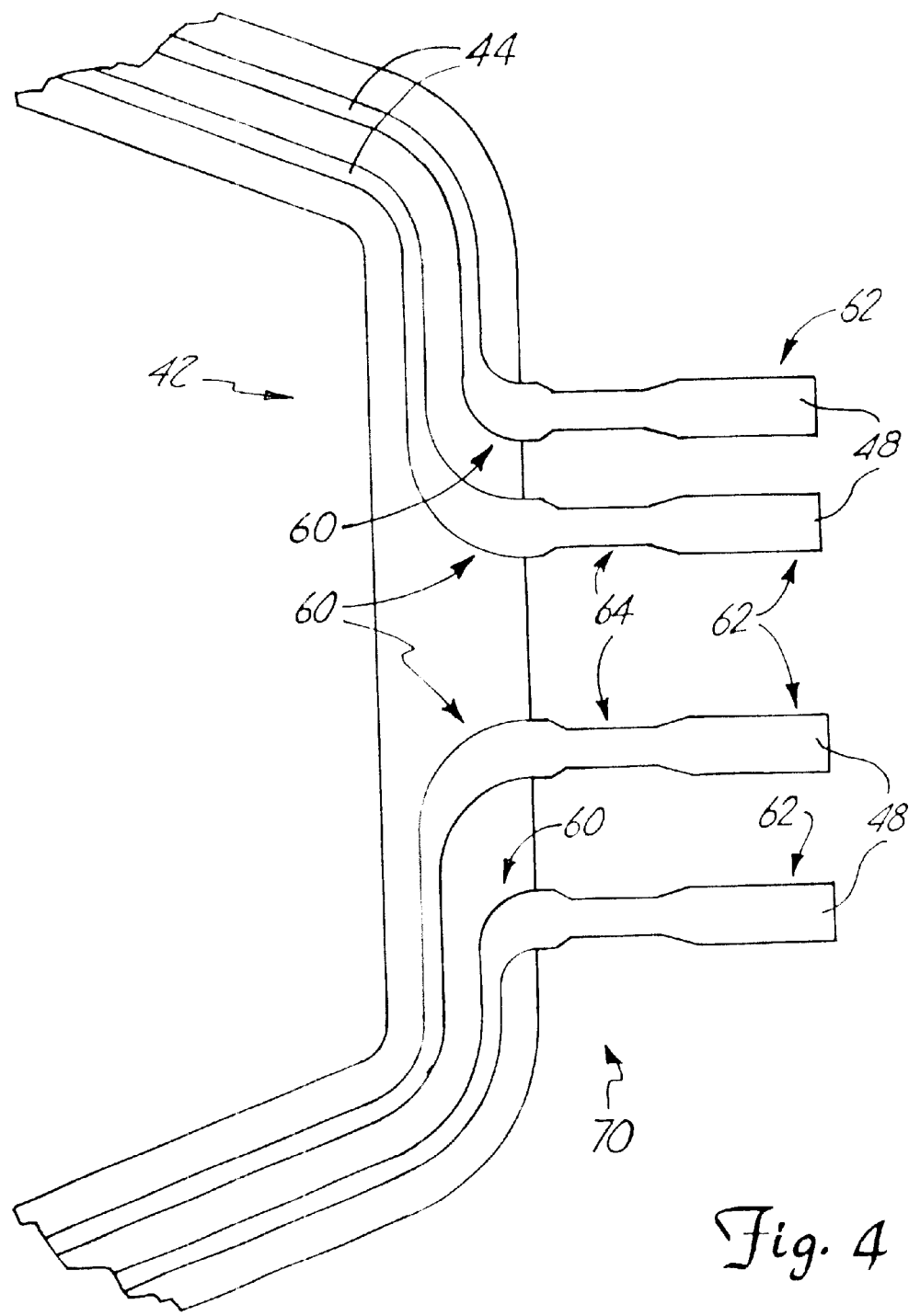
FIG. 4 is a top view of a head gimbal assembly variable width head leads wherein the leads have not been assembled to a head.

FIG. 4 is a plan view of a portion of an unassembled head gimbal assembly 70. The unassembled head gimbal assembly 70 comprises the flexible interconnect circuit 42, traces 44, and leads 48. The leads 48 have not yet been bent to allow the ends of the leads 48 to be affixed to bond pads on the transducing head. The narrow middle portion 64 can be more clearly seen, as can the knuckle 60 and heel 62. In a preferred embodiment, the leads 48 have a 0.003 inch width at the heel 62 and knuckle 60. The leads 48 further have a width of 0.002 inches at the narrow portion 64 between the knuckle 60 and heel 62. Such a design insures a low stiffness and high robustness of the leads 48.

Other widths at points on the leads 48 are possible. The knuckle portion 60 can be made wider than 0.003 inches. In fact, the knuckle portion 60 can be as wide as will allow, up to the point where the leads 48 begin to overlap each other. Similarly, the heel portion 62 can be made as wide as will allow up to the point where the leads 48 no longer fit the bond pads 48. The narrow portion 64 can likewise be made narrower than 0.002 inches, though it becomes increasingly more difficult to manufacture at smaller widths. In addition, if the narrow portion 64 becomes too narrow, the leads 48 become unacceptably fragile and difficult to handle without causing breakage. Thus, though disclosed as having a heel 62 and knuckle 60 portion with a width of 0.003 inches, other widths for the heel 62 and knuckle 60 are possible. Likewise, though disclosed as having a narrow portion 64 with a width of 0.002 inches, the narrow portion 64 can likewise have varying widths.

Although the present invention has been described with reference to preferred embodiments, workers skilled in the art will recognize that changes may be made in form and detail without departing from the spirit and scope of the invention. For instance, though discussed as being used in standard head gimbal assemblies, the present invention may be utilized in a variety of head gimbal assemblies. In addition, the present invention is useful for any flex on suspension to PCC (preamp chip carrier/printed circuit cable) interconnects with solder or flying leads.

What is claimed is:

1. Interconnecting leads for use in a flexible interconnect circuit to electrically connect a transducing head to the flexible interconnect circuit, the interconnecting leads comprising:
    a knuckle located at a first bend in the lead formed by increasing a width of the lead where the interconnecting lead becomes unsupported by a substrate of the flexible interconnect circuit;
    a heel located at a second bend in the lead formed by increasing a width of the lead adjacent a bond pad; and
    a middle portion between the knuckle and heel which is narrower than the knuckle and the heel.

2. The interconnecting leads of claim 1 wherein the width of the knuckle is about 0.003 inches.

3. The interconnecting leads of claim 1 wherein the width of the heel is about 0.003 inches.

4. The interconnecting leads of claim 1 wherein the width of the middle portion is about 0.002 inches.

5. An interconnecting circuit for use in a transducing head gimbal assembly, the interconnecting circuit comprising:
    a transducing head having a plurality of head bond pads;
    an interconnect circuit substrate; and
    an interconnecting lead on the substrate for connecting the interconnect circuit and the transducing head, wherein the interconnecting lead comprises:
    a portion having an increased width to form a knuckle where the lead becomes unsupported by the substrate,
    a portion having an increased width to form a heel where the lead meets a head bond pad,
    a middle portion which is narrower than the knuckle and heel;
    wherein the knuckle, middle portion, and heel are unsupported by the substrate, and
    a bonded area connecting the interconnecting lead to the head bond pads.

6. The interconnecting circuit of claim 5 wherein a width of the knuckle and a width of the heel are larger than a width of the narrow middle portion.

7. The interconnecting circuit of clams 5 wherein the width of the knuckle is about 0.003 inches.

8. The interconnecting circuit of claim 5 herein the width of the heel is about 0.003 inches.

9. The interconnecting circuit of claim 5 wherein the middle portion is about 0.002 inches wide.

10. An interconnect lead in an interconnect circuit for connecting a flexible interconnect circuit and a transducing head, the interconnect lead comprising:
    a knuckle where the lead undergoes a first bend, wherein the knuckle is formed by increasing a width of the lead where the interconnecting lead becomes unsupported by a substrate of the flexible interconnecting circuit;

a heel where the lead undergoes a second bend, wherein the heel is formed by increasing a width of the lead adjacent a head bond pad; and a middle portion between the knuckle and the heel which is narrower than the knuckle and the heel.

11. The interconnect lead of claim 10 wherein the width of the knuckle is about 0.003 inches.

12. The interconnect lead of claim 10 wherein the width of the heel is about 0.003 inches.

13. The interconnect lead of claim 10 wherein the width of the narrow portion is about 0.002 inches.

* * * * *

UNITED STATES PATENT AND TRADEMARK OFFICE
CERTIFICATE OF CORRECTION

PATENT NO. : 6,728,068 B1
DATED : April 27, 2004
INVENTOR(S) : Adam K. Himes et al.

It is certified that error appears in the above-identified patent and that said Letters Patent is hereby corrected as shown below:

Title page,
Item [57], ABSTRACT,
Line 4, delete "transduction", insert -- transducing --

Column 3,
Line 5, delete "of, bold", insert -- of, gold --

Column 4,
Line 57, delete "clams", insert -- claim --
Line 59, delete "herein", insert -- wherein --

Signed and Sealed this

Fourteenth Day of December, 2004

JON W. DUDAS
*Director of the United States Patent and Trademark Office*